United States Patent
Ihlenburg

(10) Patent No.: US 10,637,229 B2
(45) Date of Patent: Apr. 28, 2020

(54) ELECTRONIC FUSE MODULE WITH BUILT IN MICROCONTROLLER AND CENTRALIZED POWER MANAGEMENT BUS

(71) Applicant: MAGNA ELECTRONICS INC., Auburn Hills, MI (US)

(72) Inventor: Joern Ihlenburg, Berlin (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 429 days.

(21) Appl. No.: 15/690,900

(22) Filed: Aug. 30, 2017

(65) Prior Publication Data

US 2018/0069389 A1    Mar. 8, 2018

Related U.S. Application Data

(60) Provisional application No. 62/382,998, filed on Sep. 2, 2016.

(51) Int. Cl.
*H02H 3/08* (2006.01)
*B60R 16/03* (2006.01)
(Continued)

(52) U.S. Cl.
CPC .............. *H02H 3/08* (2013.01); *B60Q 1/0094* (2013.01); *B60R 16/0207* (2013.01);
(Continued)

(58) Field of Classification Search
CPC .......... H02H 3/08; H02H 3/087; H02H 3/063; H02H 7/261; B60R 16/03; B60R 16/0207;
(Continued)

(56) References Cited

U.S. PATENT DOCUMENTS 5,612,662 A   3/1997 Drekmeier et al.
5,896,080 A   4/1999 Chen
(Continued)

FOREIGN PATENT DOCUMENTS

DE   2058357 A1   6/1972
DE   7520602 U    10/1975
(Continued)

*Primary Examiner* — Dharti H Patel
(74) *Attorney, Agent, or Firm* — Honigman LLP

(57) ABSTRACT

An electronic fuse module for an electrical system of a vehicle includes a housing, an electronic fuse disposed at the housing, a local controller disposed at the housing, and a transceiver disposed at the housing. The electronic fuse module, when the electronic fuse module is in communication with an electronic control unit and a controlled device of the electrical system, communicates with the electronic control unit of the electrical system. The local controller is configured to locally control load limits and a reset policy of the electronic fuse. The local controller is configured to communicate with the electronic control unit via the transceiver to cooperate with a central rule for electrical loads within the electrical system. The local controller is configured to locally control (i) electrical load limits of the electronic fuse and (ii) a reset policy of the electronic fuse.

20 Claims, 3 Drawing Sheets

(51) Int. Cl.
  *B60R 16/02* (2006.01)
  *B60Q 1/00* (2006.01)
  *F02P 7/077* (2006.01)
  *H03K 17/687* (2006.01)
  *H02H 3/087* (2006.01)
  *H02H 3/06* (2006.01)
  *H02H 7/26* (2006.01)

(52) U.S. Cl.
  CPC .............. *B60R 16/03* (2013.01); *F02P 7/077* (2013.01); *H02H 3/063* (2013.01); *H02H 3/087* (2013.01); *H02H 7/261* (2013.01); *H03K 17/687* (2013.01); *B60Y 2410/115* (2013.01)

(58) Field of Classification Search
  CPC ..... B60Q 1/0094; F02P 7/077; H03K 17/687; B60Y 2410/115
  USPC .......................................................... 361/101
  See application file for complete search history.

(56) References Cited

U.S. PATENT DOCUMENTS

| | | |
|---|---|---|
| 6,175,480 B1 | 1/2001 | Karmazyn |
| 9,670,895 B2 | 6/2017 | Vogelbacher |
| 9,890,760 B2 | 2/2018 | Vogelbacher |
| 10,151,292 B2 | 12/2018 | Vogelbacher et al. |
| 10,174,738 B2 | 1/2019 | Vogelbacher |
| 2009/0127249 A1 | 5/2009 | Bauer et al. |
| 2014/0355162 A1 | 12/2014 | Biegert |
| 2015/0349471 A1* | 12/2015 | Maki .................. H01R 13/6691 307/10.1 |

FOREIGN PATENT DOCUMENTS

| | | |
|---|---|---|
| DE | 3930819 A1 | 3/1991 |
| DE | 4219554 A1 | 12/1993 |
| DE | 4437122 A1 | 4/1996 |
| DE | 19639427 A1 | 3/1997 |
| DE | 19647035 A1 | 11/1997 |
| DE | 10044081 A1 | 4/2002 |
| DE | 10102235 A1 | 8/2002 |
| DE | 102004014660 A1 | 7/2005 |
| DE | 102005005549 A1 | 8/2006 |
| DE | 102005014601 A1 | 10/2006 |
| DE | 102006026406 A1 | 12/2007 |
| DE | 102007035899 A1 | 2/2009 |
| DE | 102008011226 A1 | 8/2009 |
| DE | 102008057166 A1 | 5/2010 |
| DE | 102008053182 A1 | 7/2010 |
| DE | 102009036578 B3 | 9/2010 |
| DE | 102011118724 A1 | 5/2013 |
| EP | 1334505 A1 | 8/2003 |
| EP | 1467603 A1 | 10/2004 |
| EP | 1560242 A1 | 8/2005 |
| EP | 2485355 A1 | 8/2012 |
| FR | 2978324 A1 | 1/2013 |
| WO | 2004002202 A1 | 12/2003 |
| WO | 2010112389 A1 | 10/2010 |

\* cited by examiner

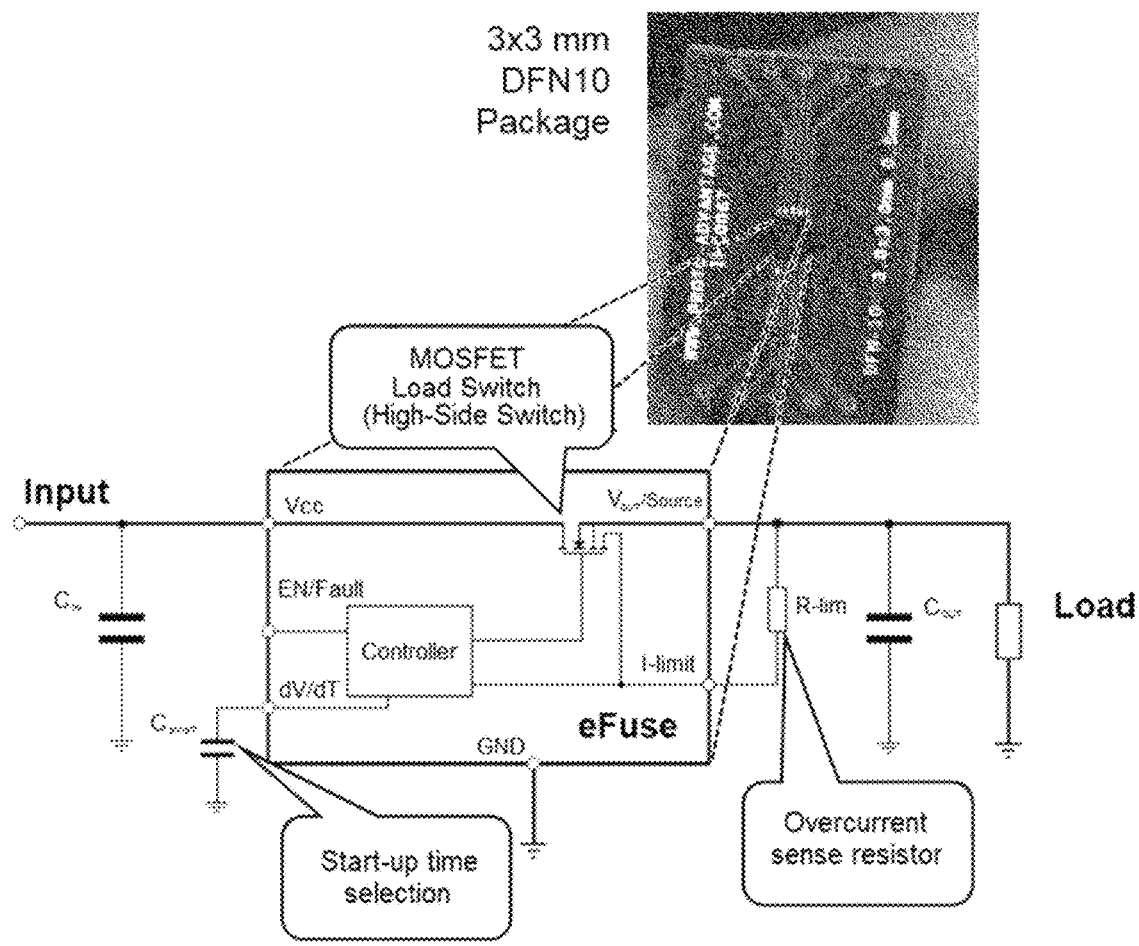
FIG. 1
FIG. 1A
FIG. 1B

ELECTRONIC FUSE MODULE WITH BUILT IN MICROCONTROLLER AND CENTRALIZED POWER MANAGEMENT BUS

CROSS REFERENCE TO RELATED APPLICATION

The present application claims the filing benefits of U.S. provisional application Ser. No. 62/382,998, filed Sep. 2, 2016, which is hereby incorporated herein by reference in its entirety.

FIELD OF THE INVENTION

The present invention relates generally to control devices and electronic systems and, more particularly, to electronic fuses for control devices and vehicle electronic control systems.

BACKGROUND OF THE INVENTION

It is known to provide a data/computing processor (such as an electronic control unit or ECU) that receives multiple inputs from and/or provides multiple outputs to multiple sensors, controls and/or accessories in an automotive vehicle. These vehicle controllers typically switch and control the current through various vehicle devices and accessories. Further, it is known to provide fuses, such as low resistance resonators, to interrupt or cut off the load or source current if the current exceeds certain levels, thereby providing overcurrent protection.

SUMMARY OF THE INVENTION

The present invention provides an intelligent electronic fuse module (iFUSE) that comprises an electronic fuse, a local controller and a transceiver for communicating with a centralized system or body controller. The iFUSE provides local control of load limits and reset policy as well as being integrated with a centralized controller that provides a central power, load limit, and reset policy for all loads within the system. The communication bus between the iFUSE and the central controller is also used for diagnostic communications, such as with a diagnostic bus (e.g., LIN) for vehicle communication (PowerBus).

These and other objects, advantages, purposes and features of the present invention will become apparent upon review of the following specification in conjunction with the drawings.

BRIEF DESCRIPTION OF THE DRAWINGS

FIG. 1 is a circuit diagram of an electronic fuse having an overcurrent sense resistor;

FIG. 1A is a schematic diagram of exemplary types of simple fault/reset fuses that may be used with an electronic fuse shown in FIG. 1;

FIG. 1B is a schematic diagram of exemplary types of enhanced diagnostic fuses that may be used with an electronic fuse shown in FIG. 1;

DESCRIPTION OF THE PREFERRED EMBODIMENTS

Figure 3:
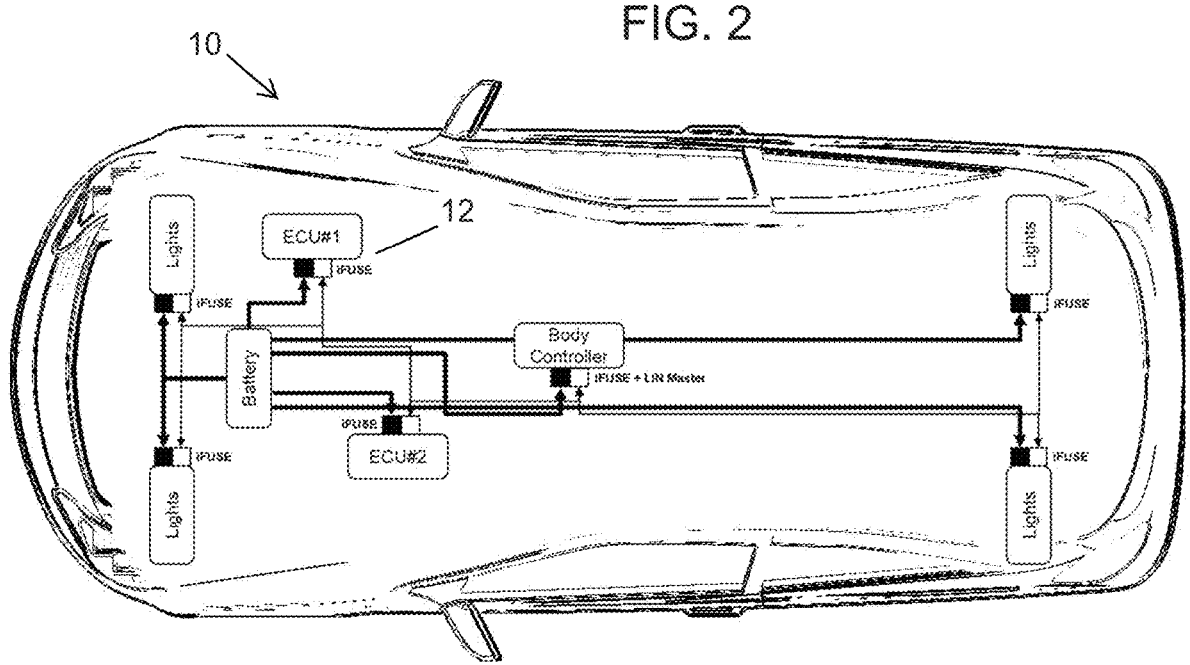
FIG. 3 is a plan view of a vehicle with a body controller, electronic control units, and lights that incorporate intelligent electronic fuses in accordance with the present invention.

Referring now to the drawings and the illustrative embodiments depicted therein, a vehicle 10 includes one or more vehicle electronic control units, such as shown in FIG. 3 as ECU #1 and ECU #2, which receive multiple inputs from and/or provides multiple outputs to multiple sensors, controls and/or accessories in the vehicle 10. These vehicle controllers typically switch and control the current through various vehicle devices and accessories. In cases of sudden overcurrent passing through the metal-oxide-semiconductor field-effect transistors (MOSFETs), such as if they become defective, it is desired for the current path through the MOSFET to be shut down. For example, as shown in FIG. 1, the current may be shut off by an electronic load switch based on high-side MOSFET (MOSFET Load Switch or High-Side Switch or eFuse). Such an eFuse can generally be turned off and on an unlimited number of times.

If the overcurrent is not shut down or switched off, there is a potential hazard that the current flow may continue, which leads to heat generation, which may lead to damage to the device (load) due to overheating or may lead to damage of power cables or batteries. For example, as shown in FIG. 1, an overcurrent sense resistor may be used by an electronic fuse, also known as an eFuse, to monitor current through a load. A conventional status indicator and resettable fuses may be used, such as the simple fault/reset fuse shown in FIG. 1A, but these can be difficult to locate outside of a traditional fuse box. Also, these fuses have an undefined reset policy for auto-reset. These fuses may be one time fuses that use bi-metals or the like to break the main power line by a single fuse. Optionally, an enhanced diagnostic fuse, such as shown in FIG. 1B, can be integrated into a connector assembly or into a cable harness. However, such enhanced electronic fuses require a central power and reset policy for all loads (such central control may be used to set load limits, reset policy, and the like).

Figure 2:
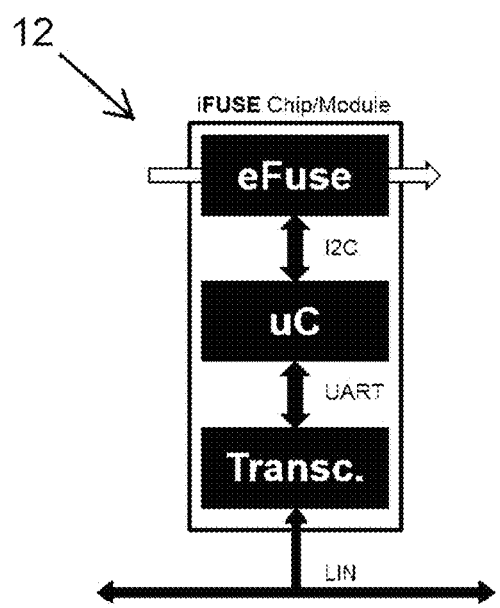
FIG. 2 is a schematic diagram of an intelligent electronic fuse in accordance with the present invention.

With reference to FIG. 2, an intelligent electronic fuse module 12 (iFUSE) is shown that comprises an electronic fuse, a local controller and a transceiver for communicating with a centralized system or body controller (see FIG. 3). The electronic fuse module may have the electronic fuse, local control and transceiver disposed at or in a housing of the module so that the iFUSE comprises a module or unit that is disposed at a system inline between a device of the system and/or controller of the system. Such an iFUSE may provide local control of load limits and reset policy as well as being integrated with a centralized controller that provides a central power, load limit, and reset policy for all loads within the system (see FIG. 3). For example, the centralized controller may have a particular reset policy for all loads or devices of the system, and each device or load may have a respective iFUSE that sets a particular reset policy for that particular device or load, which may be different from the reset policy of the other devices or loads and of the overall system. For example, if a current at a particular device is below the overall load limit for the system, but at or above the load limit for that particular device (as set by the iFUSE at that particular device), that device may be shut down while the rest of the system continues to operate. The communication bus between the iFUSE and the central controller may also be used for diagnostic communications, such as with a diagnostic bus (e.g., LIN) for vehicle communication (PowerBus).

Figure 6:
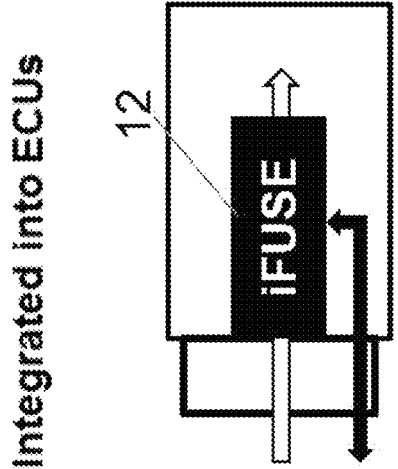
FIG. 6 is a schematic diagram of an intelligent electronic fuse integrated into an electronic control unit.
Figure 5:
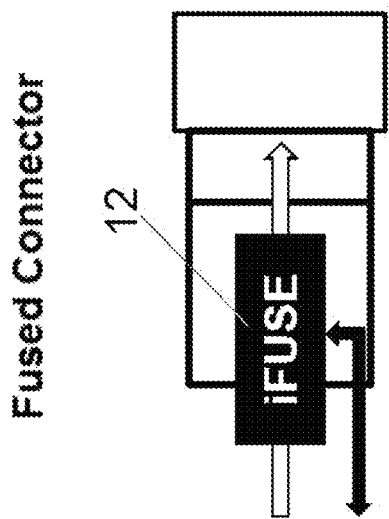
FIG. 5 is a schematic diagram of an intelligent electronic fuse embodied as a fused connector.
Figure 4:
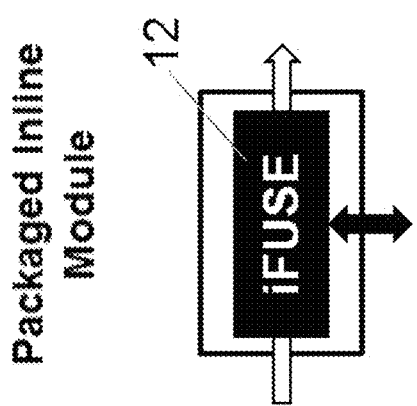
FIG. 4 is a schematic diagram of an intelligent electronic fuse embodied as a packaged inline module.

Optionally, an all-in-one hybrid package is preferred for an iFuse, as shown for example in FIGS. 4-6. As shown in FIG. 4, an intelligent electronic fuse (iFuse) is a packaged inline module that is spliced or otherwise integrated into a wire or cable harness. Optionally, and such as shown in FIG. 5, an intelligent electronic fuse (iFuse) may be embodied as a fused connector, where the iFuse is integrated into a power connector or connector assembly for a wire or cable harness. Optionally, and such as shown in FIG. 6, an intelligent electronic fuse may optionally be integrated into an electronic control unit (ECU).

The intelligent electronic fuse control (see "controller" in FIG. 1 or "μC" (microcomputer) in FIG. 2) may comprise comparably simple logic chips or gate circuits, or comparably more sophisticated fixed or hard programmable logics, ASICS, DSPs or software programmed logics, such as microprocessors or one time programmable processor logics (OTPs). Optionally, one intelligent electronic fuse (iFuse) controller or the controller of the device or plug in which it is optionally integrated (ECU) may control (or supervise) multiple [fused] power [load] current circuits. For example, glow plug control units may have a one-time fuse node for each Diesel engine glow plug. These one-time fuses may be replaced by iFuses integrated into the glow plug control unit.

Optionally, only four terminals of the iFUSE may be needed (IN, OUT, GND, LIN). Also, the iFUSE may have 12V and 48V variants, if necessary.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. An electronic fuse module for an electrical system of a vehicle, the electronic fuse module comprising:
   a housing;
   an electronic fuse disposed at the housing;
   a local controller disposed at the housing and electrically connected to the electronic fuse;
   a transceiver disposed at the housing and electrically connected to the local controller;
   wherein the electronic fuse module is configured to be electrically connected with (i) an electronic control unit of the electrical system of the vehicle and (ii) a controlled device of the electrical system of the vehicle;
   wherein the electronic fuse module, when the electronic fuse module is electrically connected with the electronic control unit of the electrical system of the vehicle and the controlled device of the electrical system of the vehicle, communicates with the electronic control unit of the electrical system, and wherein the local controller is configured to communicate with the electronic control unit via the transceiver to cooperate with a central rule for electrical loads within the electrical system of the vehicle; and
   wherein the local controller is configured to locally control (i) electrical load limits of the electronic fuse and (ii) a reset policy of the electronic fuse.

2. The electronic fuse module of claim 1, wherein the central rule comprises a central power policy for the electrical system of the vehicle.

3. The electronic fuse module of claim 1, wherein the central rule comprises a load limit policy for the electrical system of the vehicle.

4. The electronic fuse module of claim 1, wherein the central rule comprises a reset policy for the electrical system of the vehicle.

5. The electronic fuse module of claim 1, wherein the electronic fuse module communicates with the electronic control unit via a communication bus of the vehicle.

6. The electronic fuse module of claim 1, wherein the electronic fuse module is packaged in-line as part of an electrical wire harness between the electronic control unit and the controlled device of the electrical system of the vehicle.

7. The electronic fuse module of claim 1, wherein the electronic fuse module is part of an electrical connector that electrically connects to the controlled device of the electrical system of the vehicle.

8. The electronic fuse module of claim 1, wherein the electronic fuse module is part of the controlled device of the electrical system of the vehicle.

9. The electronic fuse module of claim 1, wherein the electronic fuse module is part of a controller of the electrical system of the vehicle.

10. The electronic fuse module of claim 1, wherein the controlled device comprises a controller of the electrical system of the vehicle.

11. The electronic fuse module of claim 1, wherein the controlled device comprises a headlamp of the electrical system of the vehicle.

12. The electronic fuse module of claim 1, wherein the electronic fuse module comprises a fuse node for a Diesel engine glow plug.

13. An electronic fuse module for an electrical system of a vehicle, the electronic fuse module comprising:
   a housing;
   an electronic fuse disposed at the housing;
   a local controller disposed at the housing and electrically connected to the electronic fuse;
   a transceiver disposed at the housing and electrically connected to the local controller;
   wherein the electronic fuse module is configured to be electrically connected with (i) an electronic control unit of the electrical system of the vehicle and (ii) a controlled device of the electrical system of the vehicle;
   wherein the electronic fuse module, when the electronic fuse module is electrically connected with the electronic control unit of the electrical system of the vehicle and the controlled device of the electrical system of the vehicle, communicates with the electronic control unit of the electrical system, and wherein the local controller is configured to communicate with the electronic control unit via the transceiver to cooperate with a central rule for loads within the electrical system of the vehicle;
   wherein the local controller is configured to locally control load limits and a reset policy of the electronic fuse;
   wherein the electronic fuse module communicates with the electronic control unit via a communication bus of the vehicle; and
   wherein the controlled device comprises a headlamp of the electrical system of the vehicle.

14. The electronic fuse module of claim 13, wherein the electronic fuse module is packaged in-line as part of an electrical wire harness between the electronic control unit and the controlled device of the electrical system of the vehicle.

15. The electronic fuse module of claim 13, wherein the electronic fuse module is part of an electrical connector that electrically connects to the controlled device of the electrical system of the vehicle.

16. The electronic fuse module of claim 13, wherein the electronic fuse module is part of the controlled device of the electrical system of the vehicle.

17. An electronic fuse module for an electrical system of a vehicle, the electronic fuse module comprising:
  a housing;
  an electronic fuse disposed at the housing;
  a local controller disposed at the housing and electrically connected to the electronic fuse;
  a transceiver disposed at the housing and electrically connected to the local controller;
  wherein the electronic fuse module is configured to be electrically connected with (i) an electronic control unit of the electrical system of the vehicle and (ii) a controlled device of the electrical system of the vehicle;
  wherein the electronic fuse module, when the electronic fuse module is electrically connected with the electronic control unit of the electrical system of the vehicle and the controlled device of the electrical system of the vehicle, communicates with the electronic control unit of the electrical system, and wherein the local controller is configured to communicate with the electronic control unit via the transceiver to cooperate with a central rule for loads within the electrical system of the vehicle;
  wherein the local controller is configured to locally control load limits and a reset policy of the electronic fuse;
  wherein the electronic fuse module communicates with the electronic control unit via a communication bus of the vehicle; and
  wherein the electronic fuse module comprises a fuse node for a Diesel engine glow plug.

18. The electronic fuse module of claim 17, wherein the electronic fuse module is packaged in-line as part of an electrical wire harness between the electronic control unit and the controlled device of the electrical system of the vehicle.

19. The electronic fuse module of claim 17, wherein the electronic fuse module is part of an electrical connector that electrically connects to the controlled device of the electrical system of the vehicle.

20. The electronic fuse module of claim 17, wherein the electronic fuse module is part of the controlled device of the electrical system of the vehicle.

* * * * *